(12) United States Patent
Koike et al.

(10) Patent No.: US 8,952,739 B2
(45) Date of Patent: Feb. 10, 2015

(54) INPUT CIRCUIT

(71) Applicant: Panasonic Corporation, Osaka (JP)

(72) Inventors: Tsuyoshi Koike, Shiga (JP); Shigeo Houmura, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/040,519

(22) Filed: Sep. 27, 2013

(65) Prior Publication Data

US 2014/0028362 A1 Jan. 30, 2014

Related U.S. Application Data

(63) Continuation of application No. PCT/JP2012/002998, filed on May 8, 2012.

(30) Foreign Application Priority Data

May 11, 2011 (JP) ................ 2011-106199

(51) Int. Cl.
*H03K 3/289* (2006.01)
*H03K 3/037* (2006.01)
*G01R 31/3185* (2006.01)
(Continued)

(52) U.S. Cl.
CPC ...... *H03K 3/0375* (2013.01); *G01R 31/318541* (2013.01); *G11C 29/1201* (2013.01); *G11C 29/32* (2013.01); *G11C 2029/3202* (2013.01)
USPC .............................. 327/202; 327/218; 326/93

(58) Field of Classification Search
CPC ... H03K 3/012; H03K 3/0372; H03K 3/0375; H03K 3/037; H03K 3/356121

USPC .............. 327/202, 203, 208, 218; 326/16, 93; 365/201, 189.12, 189.011, 189.16; 714/731
See application file for complete search history.

(56) References Cited

U.S. PATENT DOCUMENTS 6,006,348 A 12/1999 Sode et al.
7,679,969 B2 * 3/2010 Ku ............................. 365/189.03
(Continued)

FOREIGN PATENT DOCUMENTS

JP 04-048493 A 2/1992
JP 07-182869 A 7/1995
(Continued)

OTHER PUBLICATIONS

International Search Report issued in International Application No. PCT/JP2012/002998 with Date of mailing Jul. 10, 2012.

*Primary Examiner* — Lincoln Donovan
*Assistant Examiner* — Thomas Skibinski
(74) *Attorney, Agent, or Firm* — McDermott Will & Emery LLP

(57) ABSTRACT

A combination circuit generates first and second internal signals according to first and second input signals, respectively. A first master latch circuit selectively captures and holds a scan-in signal and the first internal signal, and generates a first output signal and a first intermediate signal based on the signals thus captured and held. A first slave latch circuit selectively captures and holds the first intermediate signal and the second internal signal, and generates a second output signal and a scan-out signal based on the signals thus captured and held. This arrangement reduces a circuit scale and power consumption of the input circuited provided in a semiconductor integrated circuit to which a scan path test method is applied.

10 Claims, 15 Drawing Sheets

(51) Int. Cl.
*G11C 29/12* (2006.01)
*G11C 29/32* (2006.01)

(56) References Cited

U.S. PATENT DOCUMENTS

2004/0001377 A1 1/2004 Kobayashi
2008/0315912 A1* 12/2008 Satsukawa ............... 326/16

FOREIGN PATENT DOCUMENTS

| JP | 10-242809 A | 11/1998 |
| JP | 2004-030829 A | 1/2004 |
| JP | 2004-117046 A | 4/2004 |

* cited by examiner

FIG. 3

| Operation mode | Input signal | | Write bit line | |
|---|---|---|---|---|
| | NBE | DI | WBL | NWBL |
| When writing data of "0" | 0 | 0 | 0 | 1 |
| When writing data of "1" | 0 | 1 | 1 | 0 |
| With write mask | 1 | 0 | 1 | 1 |
| | 1 | 1 | 1 | 1 |

INPUT CIRCUIT

RELATED APPLICATIONS

This application is Continuation Application of International Application No. PCT/JP2012/002998, filed on May 8, 2012, which in turn claims the benefit of Japanese Application No. 2011-106199, filed on May 11, 2011, the disclosures of which are incorporated by reference herein.

BACKGROUND OF THE INVENTION

1. Field of the Invention

The present invention relates to an input circuit, and more particularly to an input circuit provided in a semiconductor integrated circuit to which a scan path test method is applied.

2. Description of the Related Art

A scan path test method is known as a failure diagnostic method of a semiconductor integrated circuit. In the scan path test method, a scan path configured of shift registers is formed by connecting, in series, flip-flops present in the semiconductor integrated circuit, and data in the flip-flops are sequentially shifted out through the scan path during the failure diagnosis.

In a block such as a storage device included in the semiconductor integrated circuit, a latch circuit captures and holds an input signal. To apply the scan path test method, as a method to incorporate the latch circuit in a scan path so as to be observable, it is known to replace the latch circuit with a scan flip-flop circuit having a shift function (e.g., Unexamined Japanese Patent Publication No. H10-242809).

SUMMARY OF THE INVENTION

When a latch circuit is replaced with a scan flip-flop circuit for each output signal line (i.e., when the scan flip-flop circuit is provided to each output signal line), a circuit scale is increased. In addition, since the number of components of the circuit increases, power consumption thereof increases. Here, a bit line to which a voltage according to a write data signal is supplied, a pre-decode address signal line to which a pre-decode address signal is supplied, or the like is an example of the output signal line.

In view of this, according to the present invention, a circuit scale and power consumption are reduced in the semiconductor integrated circuit to which the scan path test method is applied while a reduction in a failure detection rate is suppressed.

According to one aspect of the present invention, an input circuit includes a combination circuit that generates first and second internal signals according to first and second input signals, respectively; a first master latch circuit that selectively captures and holds a scan-in signal and the first internal signal generated by the combination circuit; and generates a first output signal and a first intermediate signal based on the signals thus captured and held; and a first slave latch circuit that selectively captures and holds the first intermediate signal generated by the first master latch circuit and the second internal signal generated by the combination circuit, and generates a second output signal and a scan-out signal based on the signals thus captured and held.

The input circuit may further include a second master latch circuit and a second slave latch circuit, in which the combination circuit further generates third and fourth internal signals according to the first and second input signals, respectively; the second master latch circuit receives the scan-out signal generated by the first slave latch circuit as a scan-in signal, selectively captures and holds the scan-in signal and the third internal signal generated by the combination circuit, and outputs a third output signal and a second intermediate signal based on the signals thus captured and held; and the second slave latch circuit selectively captures and holds the second intermediate signal generated by the second master latch circuit and the fourth internal signal generated by the combination circuit, and generates a fourth output signal and a scan-out signal based on the signals thus captured and held.

According to another aspect of the present invention, the input circuit include a combination circuit that generates first and second internal signals according to first and second input signals, respectively; a scan flip-flop circuit that selectively captures and holds a scan-in signal and the first internal signal generated by the combination circuit, and generates a first output signal and a scan-out signal based on the signals thus captured and held; and a first latch circuit that captures and holds the second internal signal generated by the combination circuit, and generates a second output signal based on the captured and held second internal signal.

Here, the input circuit may further include second and third latch circuits, in which the combination circuit further generates third and fourth internal signals according to the first and second input signals, respectively; the second latch circuit captures and holds the third internal signal generated by the combination circuit, and generates a third output signal based on the captured and held third internal signal; and the third latch circuit captures and holds the fourth internal signal generated by the combination circuit, and generates a fourth output signal based on the captured and held fourth internal signal.

According to yet another aspect of the present invention, the input circuit includes an input processing circuit that generates a third input signal based on a first input signal, and generates a fourth input signal based on a second input signal; a first master latch circuit that selectively captures and holds a scan-in signal and the third input signal generated by the input processing circuit, and generates a first internal signal and a first intermediate signal based on the signals thus captured and held; a first slave latch circuit that selectively captures and holds the first intermediate signal and the first input signal generated by the first master latch circuit, and generates a second internal signal and a scan-out signal based on the signals thus captured and held; a second master latch circuit that receives the scan-out signal generated by the first slave latch circuit as a scan-in signal, selectively captures and holds the scan-in signal and the fourth input signal generated by the input processing circuit, and generates a third internal signal and a second intermediate signal based on the signals thus captured and held; a second slave circuit that selectively captures and holds the second intermediate signal generated by the second master latch circuit and the second input signal, and generates a fourth internal signal and a scan-out signal based on the signals thus captured and held; and a combination circuit that generates first to fourth output signals according to the first to fourth internal signals.

According to the aforementioned input circuits, it is possible to reduce more the number of scan flip-flop circuits while a reduction in a failure detection rate is suppressed than in the case where the scan flip-flop circuit is provided to each output signal line, and therefore a circuit scale can be reduced. Further, since the number of components of the input circuit can be reduced, it is possible to reduce the power consumption of the input circuit.

BRIEF DESCRIPTION OF DRAWINGS

FIG. 3 is a diagram for describing an input and output relation of an input circuit;

DETAILED DESCRIPTION OF THE PREFERRED EMBODIMENTS

The present invention will be described hereinafter with reference to the accompanying drawings that are presented for illustrating, not restricting, the present invention. Although the present disclosure is described hereinafter taking an SRAM (Static Random Access Memory) as an example, it is also applicable to the other fields. In addition, for the sake of description, the last digit of a reference symbol (such as [0] or [1]) may be omitted in the description hereinafter.

First Exemplary Embodiment

Figure 1:
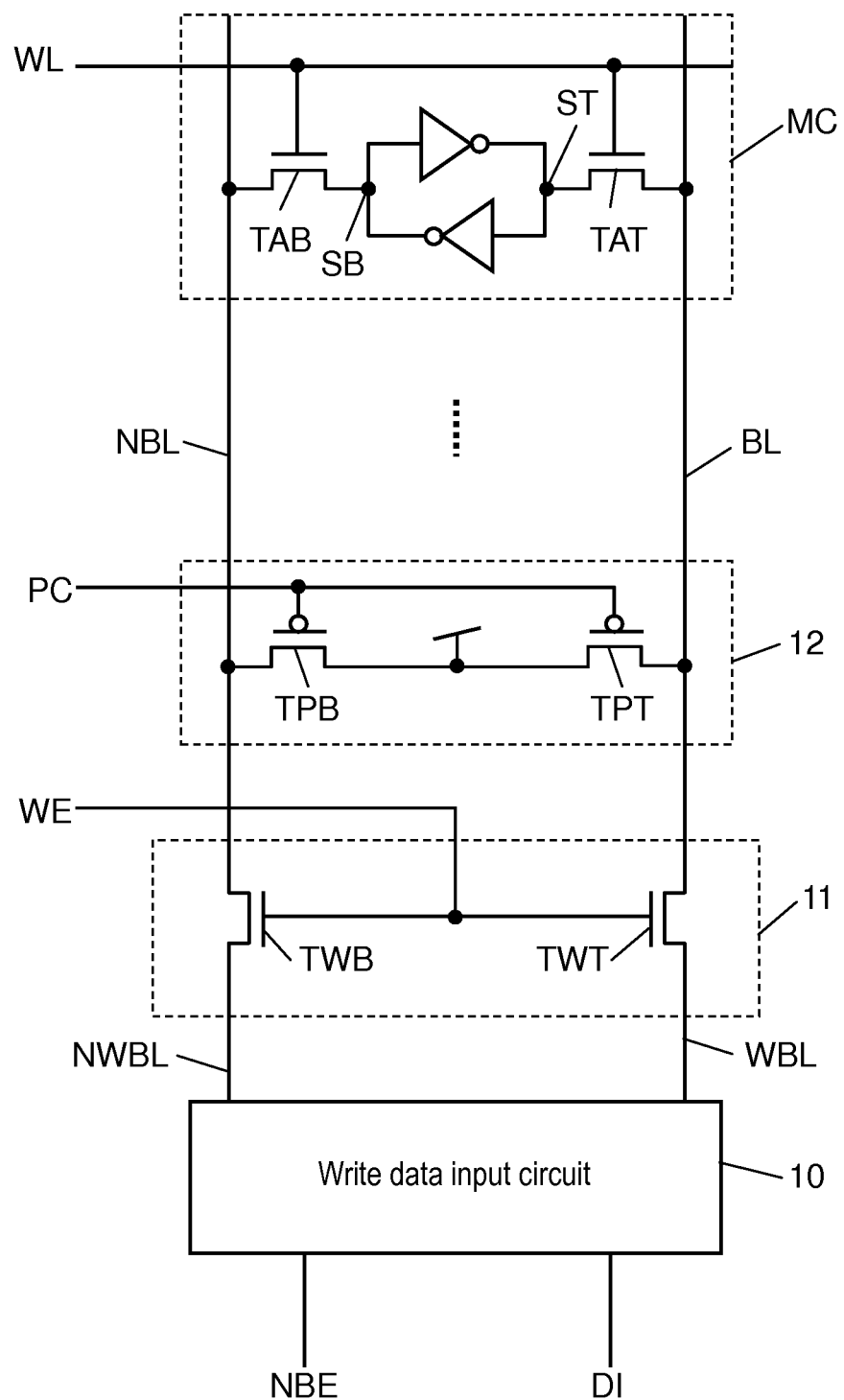
FIG. 1 is a diagram illustrating a configuration example of a memory cell and a write circuit incorporated in an SRAM.
Figure 2:
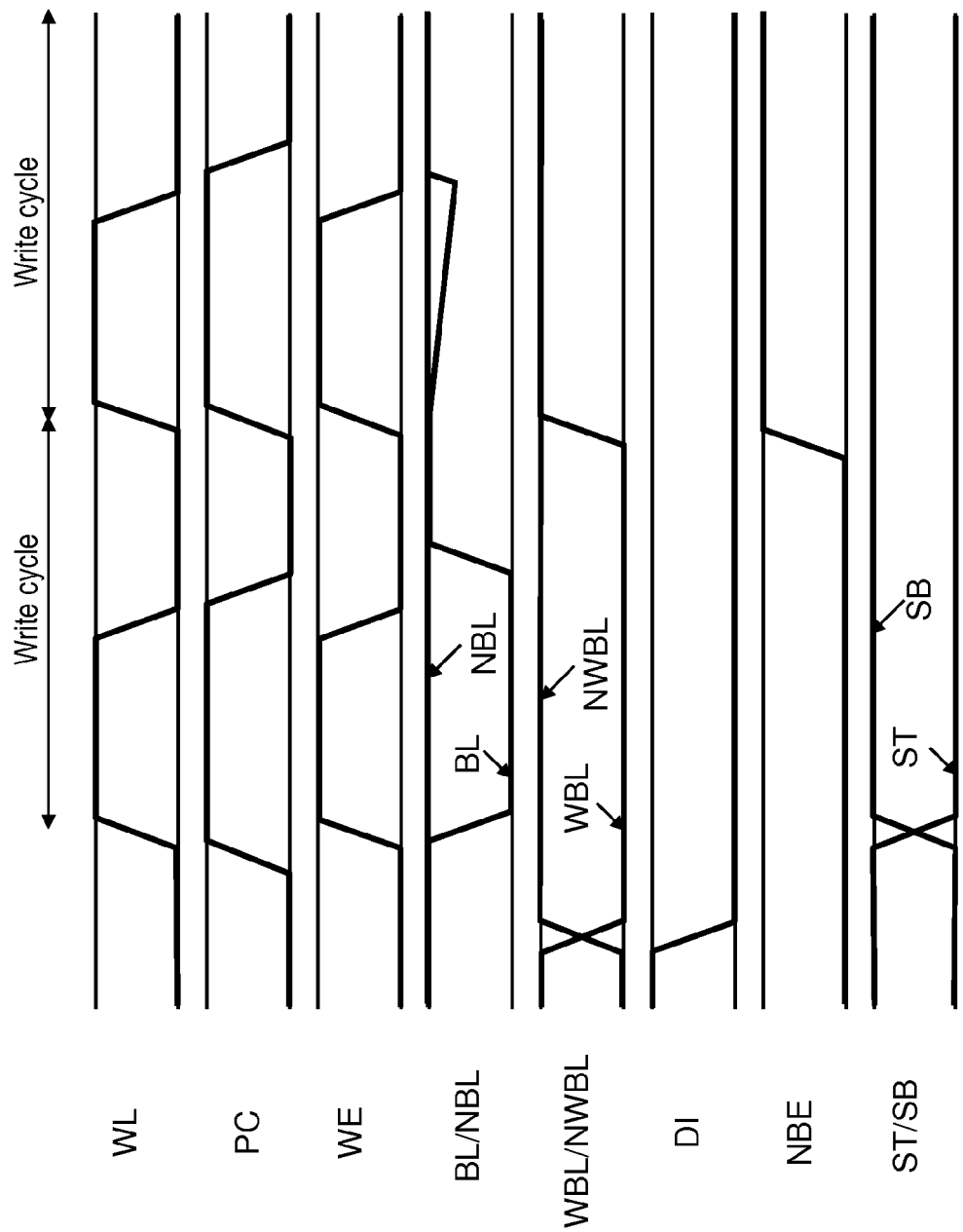
FIG. 2 is a diagram for describing write operation of the SRAM.

An input circuit compatible with a scan path test method can be used as a data input circuit for writing data to an SRAM. FIG. 1 is a diagram illustrating a configuration example of memory cell MC and a write circuit incorporated in the SRAM. The write circuit includes write data input circuit 10, write control circuit 11, pre-charge circuit 12, and the like. Here, write operation of the SRAM will be described with reference to FIG. 2. Since a voltage level of word line WL and a signal level of write control signal WE are at a low level until write operation starts, access transistors TAT and TAB of memory cell MC, and control transistors TWT and TWB of write control circuit 11 are in an OFF state. In contrast, since a signal level of pre-charge control signal PC is at a low level, pre-charge transistors TPT and TPB are in an ON state. With this arrangement, voltage levels of bit lines BL and NBL are held at a high level. When write operation starts, the signal level of pre-charge control signal PC changes from a low level to a high level, and therefore pre-charge transistors TPT and TPB are tuned into an OFF state. At the same time, the voltage level of word line WL and the signal level of write control signal WE change from a low level to a high level, and therefore access transistors TAT and TAB, and write control transistors TWT and TWB are turned into an ON state. Further, write data input circuit 10 changes voltage levels of write bit lines WBL and NWBL according to write data mask signal NBE and write data signal DI. FIG. 3 illustrates a truth table between write data mask signal NBE and write data signal DI, and write bit lines WBL and NWBL. Since write control transistors TWT and TWB are in the ON state, voltage changes of write bit lines WBL and NWBL are respectively conducted to bit lines BL and NBL. Further, since access transistors TAT and TAB are in the ON state, bit data ("1" or "0") is written in memory cell MC according to voltage changes of bit lines BL and NBL.

[Input Circuit]

Figure 4:
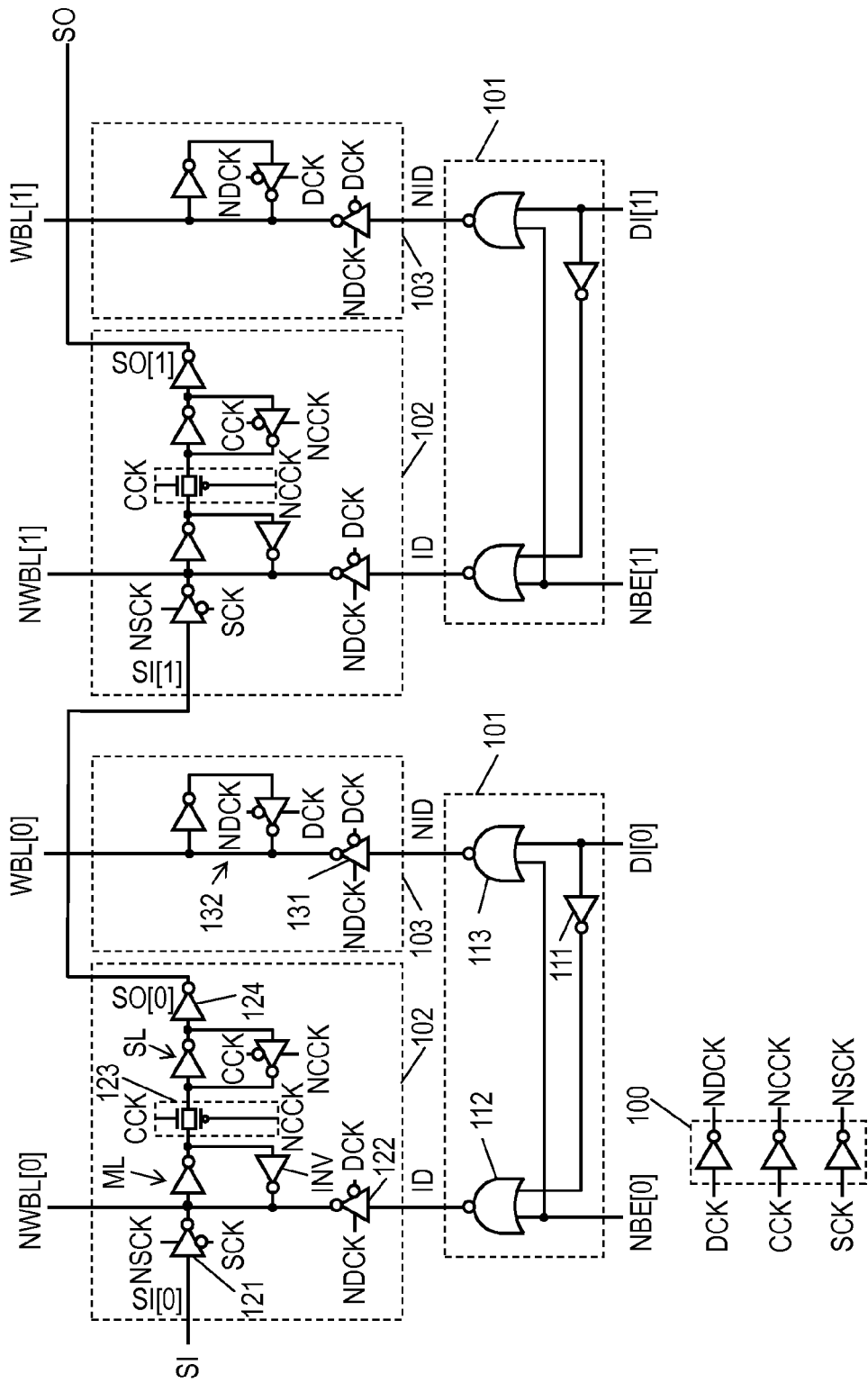
FIG. 4 is a diagram illustrating a configuration example of an input circuit according to a first exemplary embodiment.

FIG. 4 illustrates a configuration example of the input circuit according to the first exemplary embodiment. The input circuit illustrated in FIG. 4 can be used as data input circuit 10 of the SRAM illustrated in FIG. 1. The input circuit is provided for each combination of write bit lines WBL and NWBL, and is provided with combination circuit 101, scan flip-flop circuit 102, and latch circuit 103. Here, an input circuit corresponding to write bit lines WBL[0] and NWBL[0] is taken as an example and described. Combination circuit 101 generates internal data signals ID and NID (first and second internal signals) according to write data signal DI[0] and write mask signal NBE[0] (first and second input signals). Scan flip-flop circuit 102 selectively captures and holds scan-in signal SI[0] and internal data signal ID. In addition, scan flip-flop circuit 102 generates an output signal (first output signal) to be outputted to write bit line NWBL[0] and scan-out signal SO[0] according to the signal that has been captured and is held. Latch circuit 103 captures and holds internal data signal NID. In addition, latch circuit 103 generates an output signal (second output signal) to be outputted to write bit line WBL[0] according to internal data signal NID that has been captured and is held. The same is also applied to an input circuit corresponding to write bit lines WBL[1] and NWBL[1].

[Combination Circuit]

Combination circuit 101 may include inverter 111 and NOR circuits 112 and 113. Inverter 111 inverts write data signal DI[0]. NOR circuit 112 outputs a negation of a logical summation of an output signal (i.e., an inverted signal of write data signal DI[0]) of inverter 111 and write data mask signal NBE[0] as internal signal ID. NOR circuit 113 outputs a negation of a logical summation of write data signal DI[0] and data mask signal NBE[0] as internal data signal NID. In this way, internal data signal NID [0] corresponds to an inverted signal of internal data signal ID [0].

[Scan Flip-Flop Circuit]

Scan flip-flop circuit 102 may include input switching portions 121 and 122, master latch ML, pass transistor 123, slave latch SL, and inverter 124. Input switching portion 121 switches between capturing and not capturing scan-in signal SI[0] in response to shift clock SCK and inverted shift clock NSCK. Input switching portion 122 switches between capturing and not capturing internal data signal ID in response to data latch clock DCK and inverted data latch clock NDCK. Master latch ML holds one of scan-in signal SI[0] and internal data signal ID according to capturing operation by input switching portions 121 and 122. The signal held by master latch ML is supplied to write bit line NWBL[0]. Pass transistor 123 switches between transferring and not transferring an output signal of master latch ML to slave latch SL in response to capture shift clock CCK and inverted capture shift clock NCCK. Slave latch SL holds the output signal of master latch ML that is transferred by pass transistor 123. Inverter 124 inverts an output signal of slave latch SL and outputs the signal thus inverted as scan-out signal SO[0]. Scan-out signal SO[0] is supplied, as scan-in signal SI[1], to scan flip-flop circuit 102 (scan flip-flop circuit 102 corresponding to write bit line NWBL[1]) which is at a subsequent stage. Further, scan-out signal SO[1] of scan flip-flop circuit 102 at the subsequent stage is also supplied, as a scan-in signal, to a scan flip-flop circuit at a further subsequent stage.

[Latch Circuit]

Latch circuit 103 may include input switching portion 131 and latch 132. Input switching portion 131 switches between capturing and not capturing internal data signal NID in response to data latch clock DCK and inverted data latch clock NDCK. Latch 132 holds internal data signal NID captured by input switching portion 131. The signal held by latch 132 is supplied to write bit line WBL[0].

[Operation]

Figure 5:
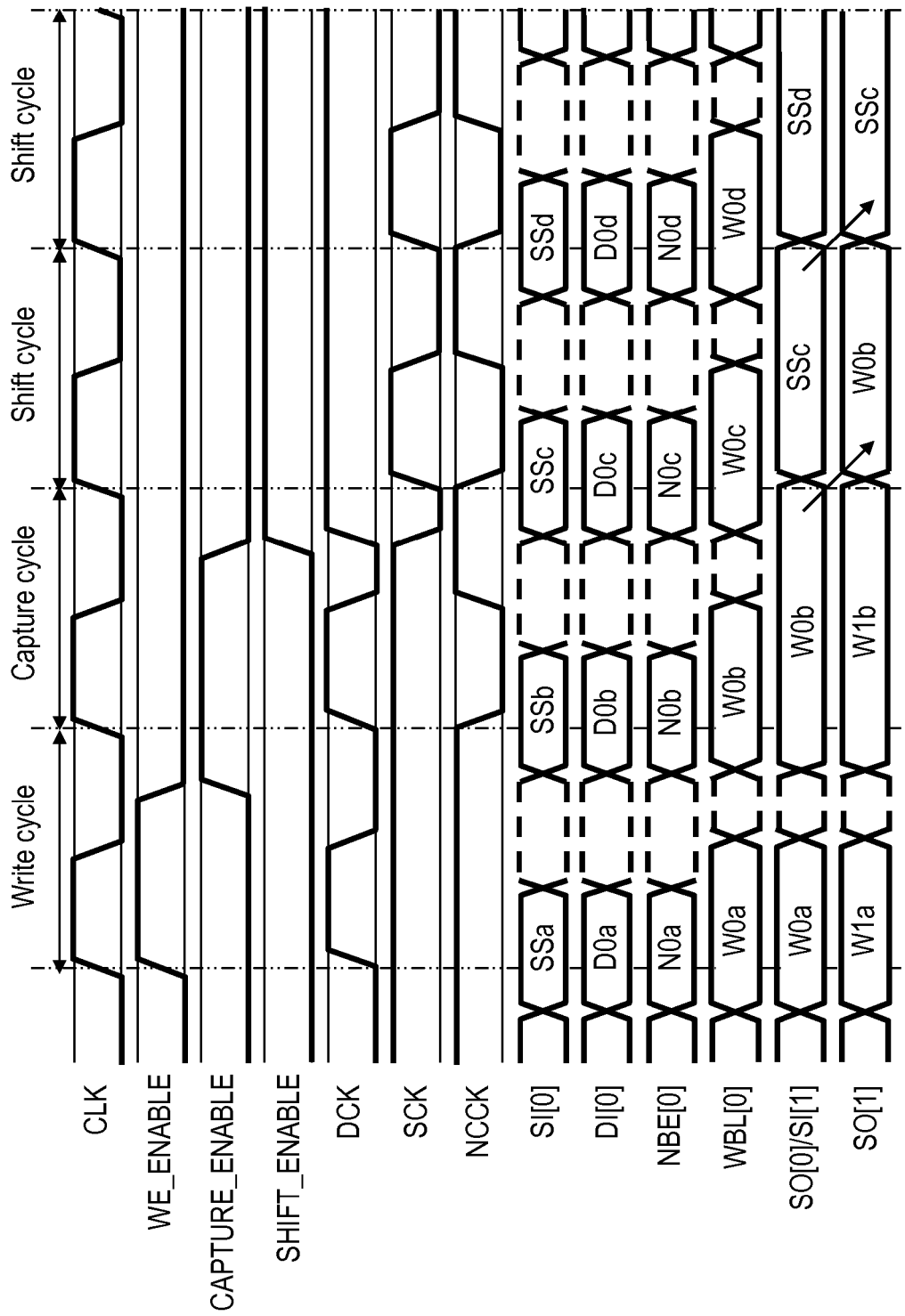
FIG. 5 is a diagram for describing operation of the input circuit illustrated in FIG. 4.

Next, operation by the input circuit illustrated in FIG. 4 will be described with reference to FIG. 5.

When a logic level of control clock CLK is at a low level during a write cycle period (a period in which a signal level of write enable signal WE_ENABLE is at a high level), input switching portion 122 is made conductive, and an internal node (internal node connected to output terminal of input switching portions 121 and 122) of master latch ML is updated according to internal data signal ID. Next, when the logic level of control clock CLK becomes a high level, input switching portion 122 is made non-conductive, and master latch ML holds the data (captured signal).

Next, during a capture cycle period (a period in which a signal level of capture enable signal CAPTURE_ENABLE is at a high level), when a logic level of control clock CLK is at a low level, input switching portion 122 is made conductive, and the internal node of master latch ML is updated according to internal data signal ID. Next, when the logic level of control clock CLK becomes a high level, input switching portion 122 is made non-conductive, and master latch ML holds the data (captured signal). Further, pass transistor 123 is made conductive, and data held by slave latch SL is updated by an output signal of master latch ML.

Next, during a shift cycle period (a period in which a signal level of shift enable signal SHIFT_ENABLE is at a high level), when the logic level of control clock CLK is at a low level, input switching portion 122 is made non-conductive, input switching portion 121 is made conductive, and the internal node of master latch ML is updated according to scan-in signal SI[0]. Next, when the logic level of control clock CLK becomes a high level, input switching portion 121 is made non-conductive, and master latch ML holds the data (captured signal). Further, pass transistor 123 is made conductive, and data held by slave latch SL is updated by the output signal of master latch ML.

Here, inverted data latch clock NDCK, inverted capture shift clock NCCK, and inverted shift clock NSCK may be generated by clock generation circuit 100. Clock generation circuit 100 generates inverted data latch clock NDCK, inverted capture shift clock NCCK, and inverted shift clock NSCK by inverting data latch clock DCK, capture shift clock CCK, and shift clock SCK, respectively. In addition, data latch clock DCK, capture shift clock CCK, and shift clock SCK may be generated based on control clock CLK, write enable signal WE_ENABLE, capture enable signal CAPTURE_ENABLE, and shift enable signal.

Comparative Example

Figure 6:
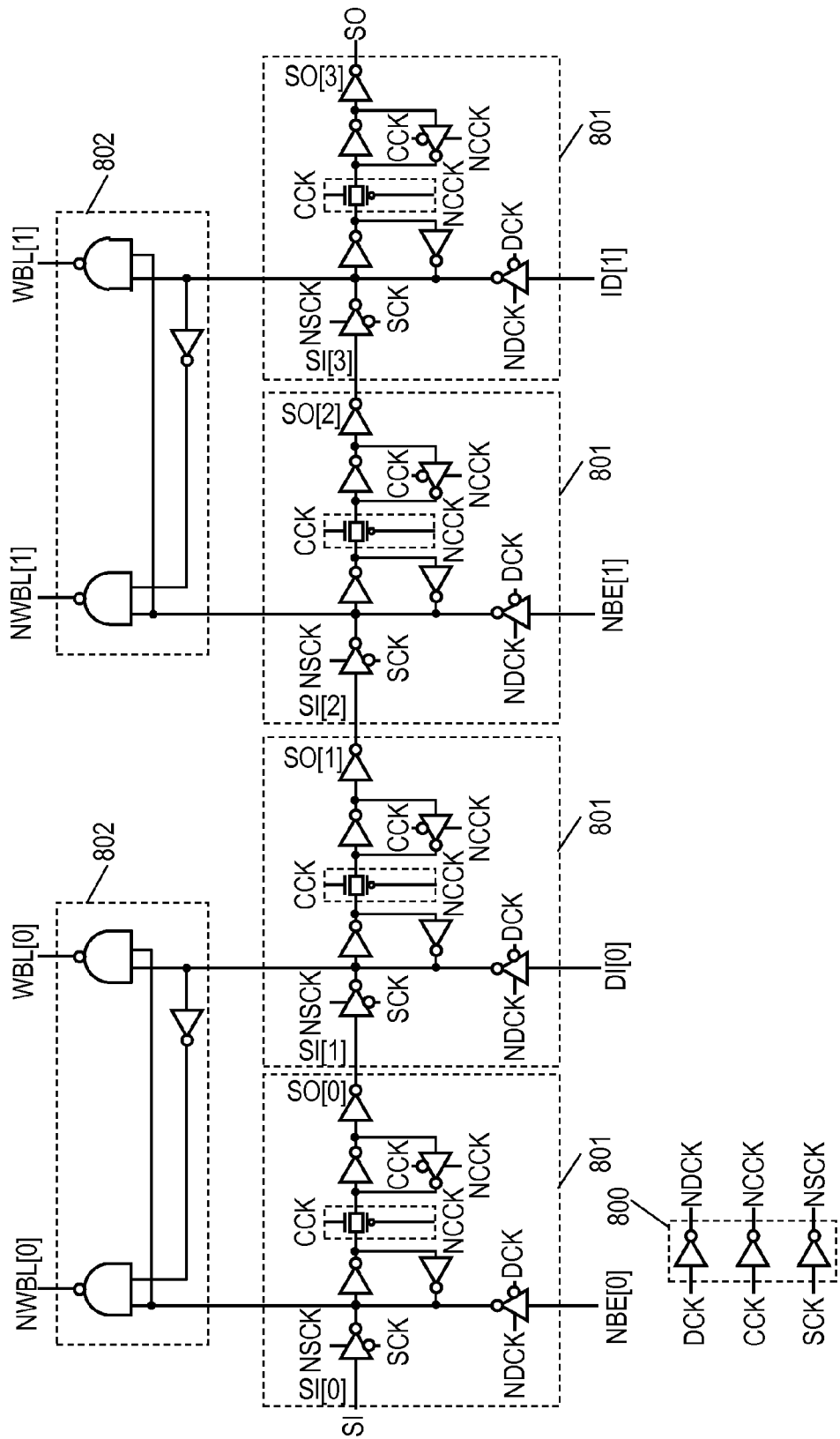
FIG. 6 is a diagram for describing a first comparative example of an input circuit.
Figure 7:
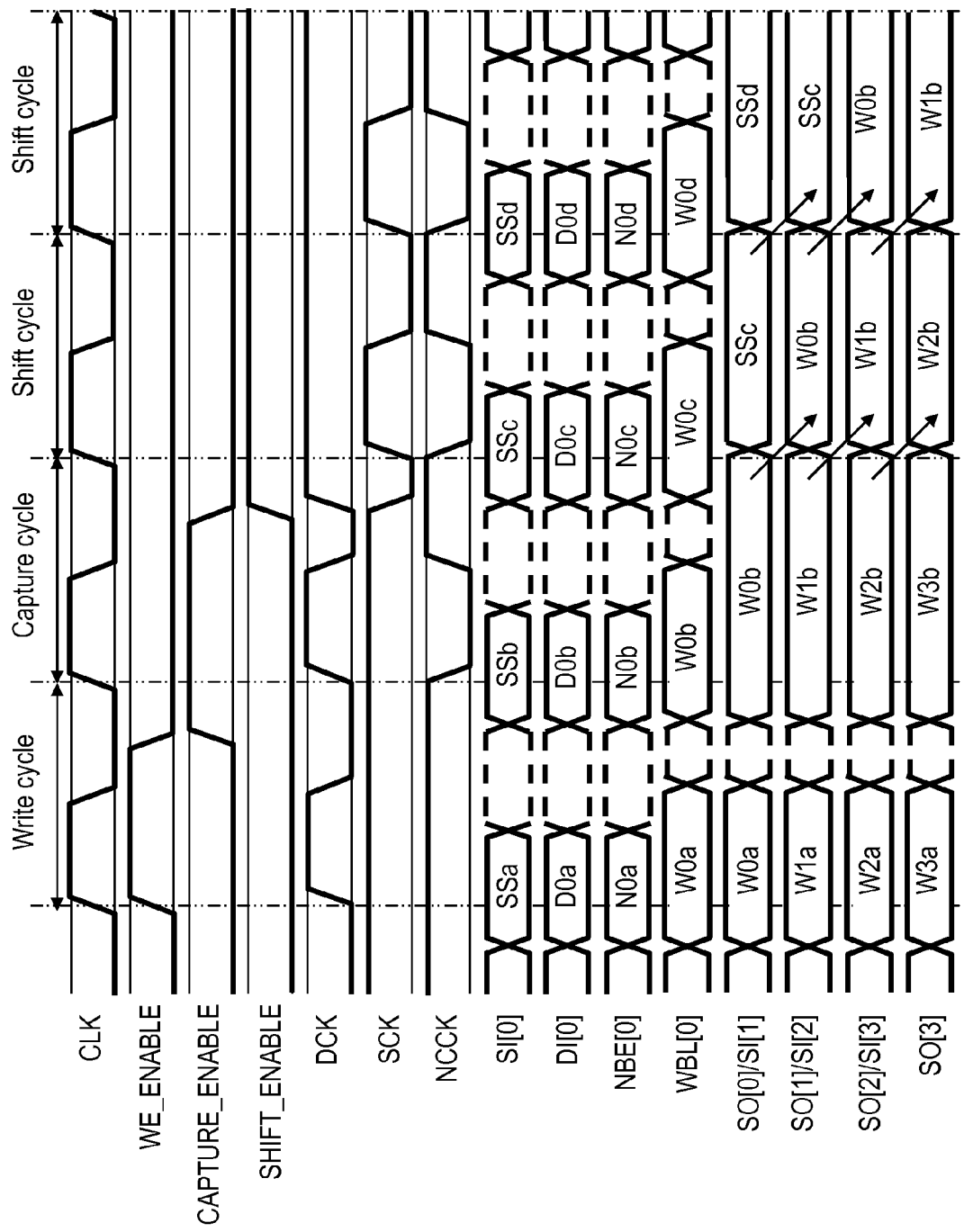
FIG. 7 is a diagram for describing operation of the first comparative example of the input circuit.

Here, a first comparative example of an input circuit will be described with reference to FIG. 6. The input circuit illustrated in FIG. 6 is provided for each combination of write bit lines WBL and NWBL, and is provided with write bit lines WBL and NWBL, two scan flip-flop circuits 801 and 801 corresponding thereto respectively, and combination circuit 802. In addition, inverted data latch clock NDCK, inverted capture shift clock NCCK, and inverted shift clock NSCK are generated by clock generation circuit 800. FIG. 7 illustrates operation of the input circuit illustrated in FIG. 6. In the input circuit illustrated in FIG. 6, scan-out signal SO[0] is supplied as scan-in signal SI[1], scan-out signal SO[1] is supplied as scan-in signal SI[2], and scan-out signal SO[2] is supplied as scan-in signal SI[3]. Scan-out signal SO[3] is also supplied to a scan flip-flop circuit at a subsequent stage as a scan-in signal.

In the input circuit illustrated in FIG. 6, the two latch circuits that respectively capture and hold write data mask signal NBE and write data signal DI are replaces with two scan flip-flop circuits 801 and 801 so that write data mask signal NBE and write data signal DI can be observed. This means that each of the write bit lines (i.e., each output signal line) is provided with scan flip-flop circuit 801.

In contrast, in the input circuit illustrated in FIG. 4, combination circuit 101 is provided at a preceding stage of scan flip-flop circuit 102 and latch circuit 103, and one (here, internal data signal ID) of internal data signals ID and NID generated by combination circuit 101 is supplied to scan flip-flop circuit 102. With this arrangement, it is possible to reduce the number of the scan flip-flop circuits while a reduction in a failure detection rate is suppressed.

As described above, since the number of the scan flip-flop circuits can be reduced while the reduction in a failure detection rate is suppressed, it is possible to reduce a circuit scale of the input circuit. In addition, since the number of components of the input circuit can be reduced, power consumption of the input circuit can be reduced. Further, since the number of clocks (types of clocks) used in the input circuit illustrated in FIG. 4 may be identical with the number of the input circuits illustrated in FIG. 6, it is possible to suppress overheads of a wiring channel.

Second Exemplary Embodiment

Figure 8:
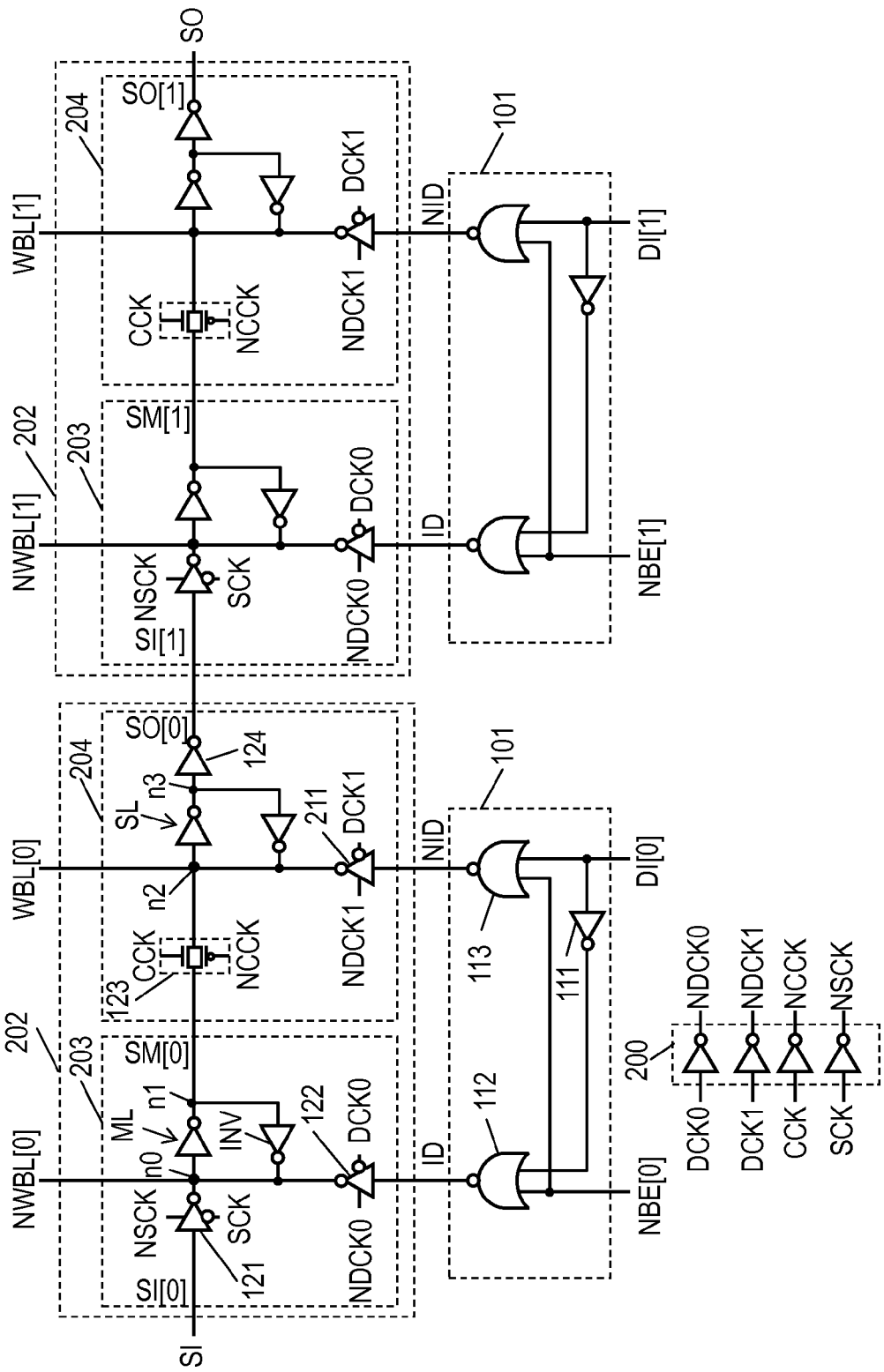
FIG. 8 is a diagram illustrating a configuration example of an input circuit according to a second exemplary embodiment.

FIG. 8 illustrates a configuration example of an input circuit according to a second exemplary embodiment. This input circuit is provided for each combination of write bit lines WBL and NWBL, and provided with combination circuit 101 and scan flip-flop circuit 202. Scan flip-flop circuit 202 includes master latch circuit 203 and slave latch circuit 204. Master latch circuit 203 selectively captures and holds therein scan-in signal SI[0], and internal data signal ID that is generated by combination circuit 101. In addition, master latch circuit 203 generates an output signal (first output signal) to be outputted to write bit line NWBL[0] and intermediate signal SM[0]. Slave latch circuit 204 selectively captures and holds therein intermediate signal SM[0], and internal data signal NID that is generated by combination circuit 101. In addition, slave circuit 204 generates an output signal (second output signal) to be outputted to write bit line WBL[0], and scan-out signal SO[0] based on the signals that have been captured and are held.

Master latch circuit 203 may include input switching portions 121 and 122, and master latch ML illustrated in FIG. 4. Here, input switching portion 122 switches between capturing and not capturing internal data signal ID in response to data latch clock DCK0 and inverted data latch clock NDCK0. Slave latch circuit 204 may include pass transistor 123, slave latch SL, inverter 124, and input switching portion 211 which are illustrated in FIG. 4. Input switching portion 211 switches between capturing and not capturing internal data signal NID generated by combination circuit 101 in response to data latch clock DCK1 and inverted data latch clock NDCK1. In this way, in the input circuit illustrated in FIG. 8, slave latch circuit 204 of scan flip-flop circuit 202 is used as latch circuit 103 illustrated in FIG. 4. Here, inverted data latch clocks NDCK0 and NDCK1, inverted capture shift clock NCCK, and inverted shift clock NSCK may be generated by clock generation circuit 200. Further, data latch clocks DCK0 and DCK1 may be generated based on control clock CLK, write enable signal WE_ENABLE, capture enable signal CAPTURE_ENABLE, and shift enable signal SHIFT_ENABLE.

Figure 9:
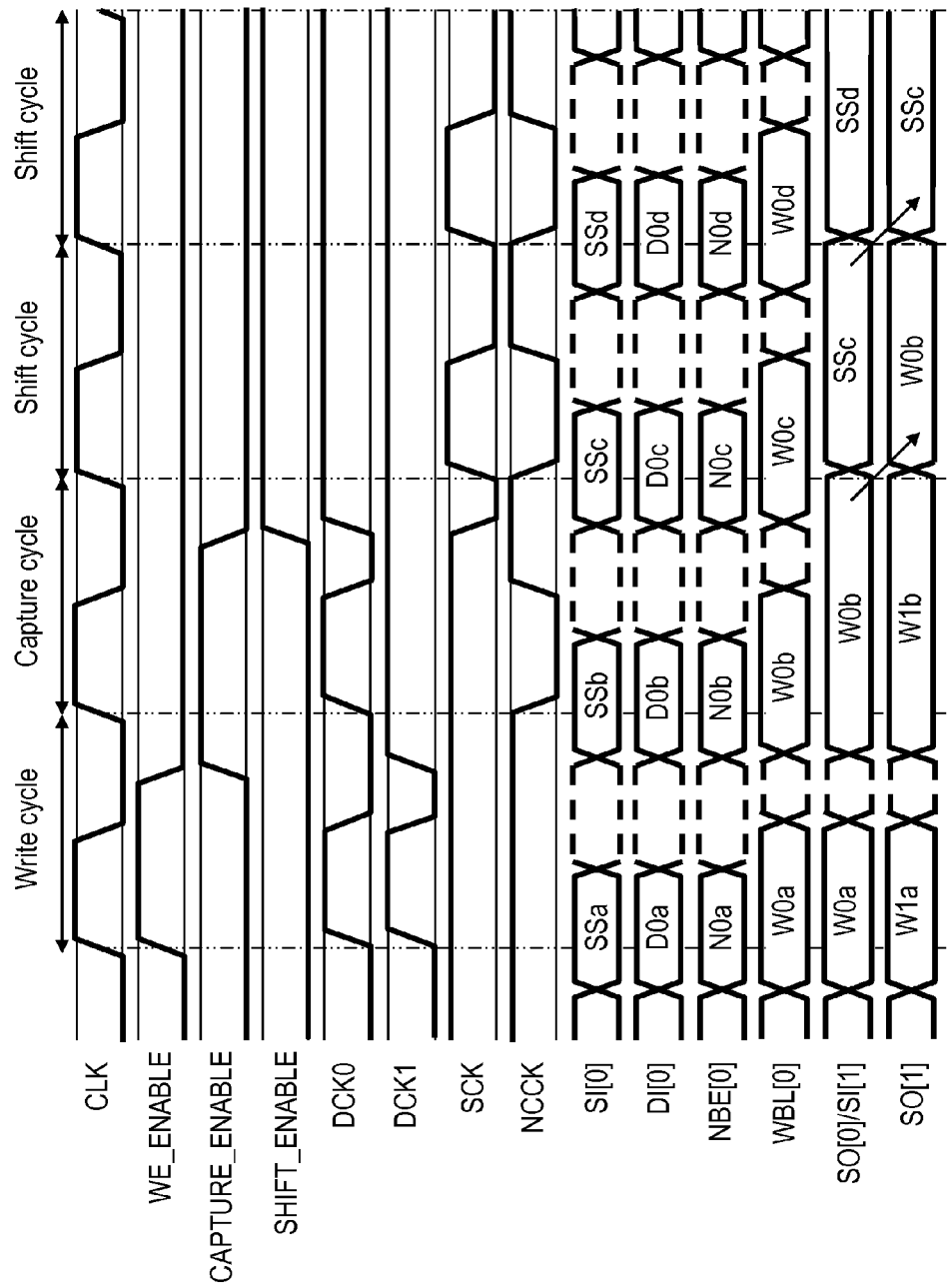
FIG. 9 is a diagram for describing operation of the input circuit illustrated in FIG. 8.

FIG. 9 illustrates operation of the input circuit illustrated in FIG. 8. Data latch clock DCK0 corresponds to data latch clock DCK illustrated in FIGS. 4 and 5. A signal level of data latch clock DCK0 becomes a low level when a logic level of control clock CLK becomes a low level during a period excluding the shift cycle period (a period in which a signal level of shift enable signal SHIFT_ENABLE is at a low level). During the shift cycle period (a period in which a signal level of shift enable signal SHIFT_ENABLE is at a high level), a signal level of data latch clock DCK0 is at a high level. In contrast, a signal level of data latch clock DCK1 becomes a low level when a logic level of control CLK becomes a low level during a period excluding the capture cycle period and the shift cycle period (a period in which both capture enable signal CAPTURE_ENABLE and shift enable signal SHIFT_ENABLE are at a low level). A signal level of data latch clock DCK1 is at a high level during the capture cycle period and the shift cycle period (a period in which the signal level of at least one of capture enable signal CAPTURE_ENABLE and shift enable SHIFT_ENABLE signal is at a high level). In this way, operation similar to that of the input circuit illustrated in FIG. 4 can be achieved by controlling data latch clocks DCK0 and DCK1.

As described above, according to the input circuit illustrated in FIG. 8, since slave latch circuit 204 of scan flip-flop circuit 202 is used as latch circuit 103 illustrated in FIG. 4, it is possible to further reduce a circuit scale and power consumption than those of the input circuit illustrated in FIG. 4.

Modified Example of Second Exemplary Embodiment

Figure 10:
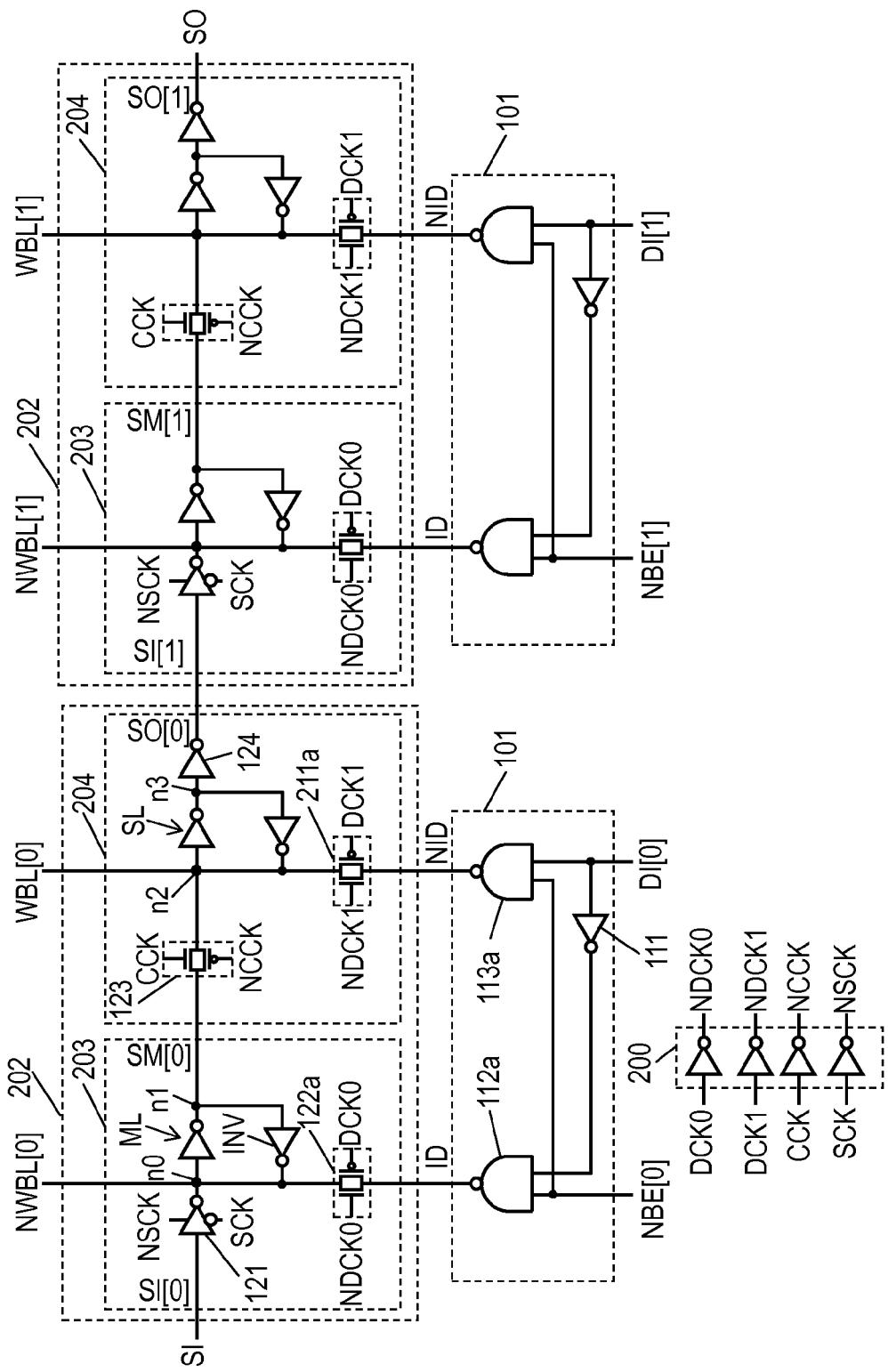
FIG. 10 is a diagram for describing a modified example of the input circuit illustrated in FIG. 8.

As illustrated in FIG. 10, master latch circuit 203 and slave latch circuit 204 may respectively include input switching portions 122a and 211a instead of input switching portions 122 and 211. Input switching portion 122a is configured of a pass transistor that switches between conduction and non-conduction according to data latch clock DCK0 and inverted data latch clock NDCK0, and input switching portion 211a is configured of a pass transistor that switches between conduction and non-conduction according to data latch clock DCK1 and inverted data latch clock NDCK1. In this case, combination circuit 101 may include NAND circuits 112a and 113a instead of NOR circuits 112 and 113. With this configuration, a setup time (a time required until voltage levels of write bit lines WBL and NWBL are finalized since write data mask signal NBE and write data signal DI are inputted) of write data can be reduced. Here, input switching portions 122 and 131 illustrated in FIG. 4 may be configured of a pass transistor that switches between conduction and non-conduction according to data latch clock DCK and inverted data latch clock NDCK.

Also, in FIG. 4, combination circuit 101 may be included in a module that includes scan flip-flop circuit 102 and latch circuit 103, or may be provided outside the module that includes scan flip-flop circuit 102 and latch circuit 103. Similarly, in FIG. 8, combination circuit 101 may be included in a module that includes scan flip-flop circuit 202, or may be provided outside the module that includes scan flip-flop circuit 202.

Also, in slave latch circuit 204 illustrated in FIG. 8, one or a plurality of buffers may be provided between pass transistor 123 and internal node n2 of slave latch SL. With this arrangement, a margin against a hold error of slave latch SL can be provided.

Third Exemplary Embodiment

Figure 11:
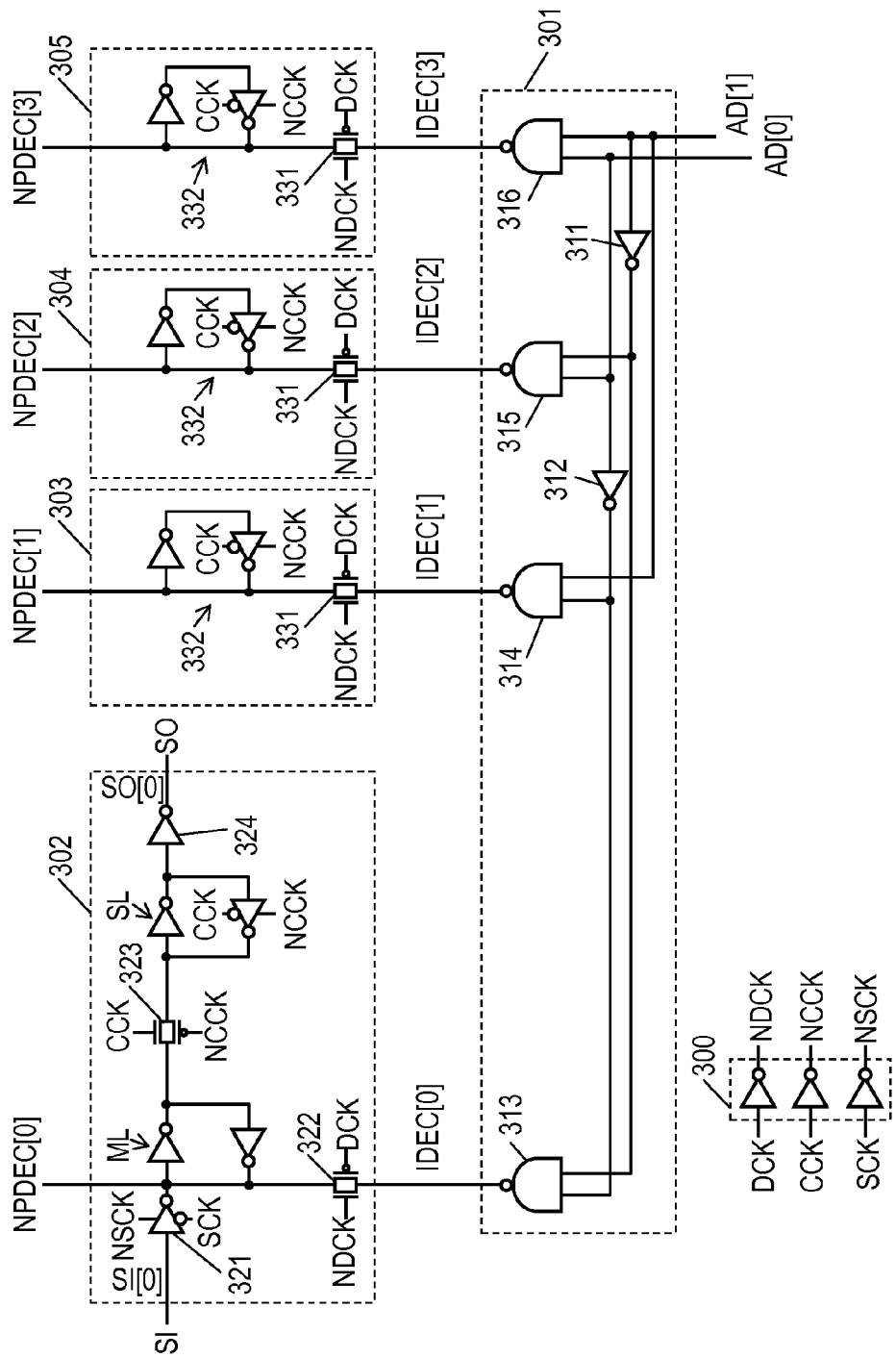
FIG. 11 is a diagram illustrating a configuration example of an input circuit according to a third exemplary embodiment.

FIG. 11 illustrates a configuration example of an input circuit according to a third exemplary embodiment. The input circuit illustrated in FIG. 11 can be used as an address input circuit of an SRAM. This input circuit is provided with a pre-decoder 301 (combination circuit), scan flip-flop circuit 302, and latch circuits 303, 304, and 305. Pre-decoder 301 generates internal decode signals IDEC[0] to IDEC[3] (first to fourth internal signals) according to input address signals AD[0] and AD[1] (first and second input signals). Scan flip-flop circuit 302 selectively captures and holds therein scan-in signal SI and internal decode signal IDEC[0]. In addition, scan flip-flop circuit 302 generates pre-decode address signal NPDEC[0] (first output signal) and scan-out signal SO based on the signals that have been captured and are held. Latch circuits 303 to 305 capture and hold therein internal decode signals IDEC[1] to IDEC[3], respectively. Further, latch circuits 303 to 305 respectively generate pre-decode address signals NPDEC[1] to NPDEC[3] (second to fourth output signals) based on internal decode signals IDEC[1] to IDEC[3] that have been captured and are held.

[Pre-Decoder]

Pre-decoder 301 may include inverters 311 and 312, and NAND circuits 313, 314, 315, and 316. Inverter 311 inverts input address signal AD[1]. Inverter 312 inverts input address signal AD[0]. NAND circuit 313 outputs a logical NAND result of output signals (i.e., inverted signal of input address signals AD[0] and AD[1]) of inverters 311 and 312 as internal decode signal IDEC[0]. NAND circuit 314 outputs a logical NAND result of the output signal (i.e., inverted signal of input address signal AD[0]) of inverter 312 and input address signal AD[1] as internal decode signal IDEC[1]. NAND circuit 315 outputs a logical NAND result of input address signal AD[0] and the output signal (i.e., inverted signal of input address signal AD[1]) of inverter 311 as internal decode signal IDEC[2]. NAND circuit 316 outputs a logical NAND result of input address signals AD[0] and AD[1] as internal decode signal IDEC[3].

[Scan Flip-Flop Circuit]

Scan flip-flop circuit 302 may include input switching portions 321 and 322, master latch ML, pass transistor 323, slave latch SL, and inverter 324. Input switching portion 321 switches between capturing and not capturing scan-in signal S[0] in response to shift clock SCK and inverted shift clock NSCK. Input switching portion 322 switches between capturing and not capturing internal decode signal IDEC[0] in response to data latch clock DCK and inverted data latch clock NDCK. Master latch ML holds one of scan-in signal SI[0] and internal decode signal IDEC[0] according to capturing operation of input switching portions 321 and 322. The signal held in master latch ML is supplied to a pre-decode address signal line as pre-decode address signal NPDEC[0]. Pass transistor 323 switches transferring and not transferring an output signal of master latch ML to slave latch SL in response to capture shift clock CCK and inverted capture shift clock NCCK. Slave latch SL holds the output signal of master latch ML that has been transferred by pass transistor 323. Inverter 324 inverts the output signal of slave latch SL and outputs the resultant as scan-out signal SO[0]. Here, inverted data latch clock NDCK, inverted capture shift clock NCCK, and inverted shift clock NSCK may be generated by clock generation circuit 300.

[Latch Circuit]

Latch circuit 303 may include input switching portion 331 and latch 332. Input switching portion 331 switches between capturing and not capturing internal decode signal IDEC[1] in response to data latch clock DCK and inverted data latch clock NDCK. Latch 332 holds internal decode signal IDEC[1] that has been captured by input switching portion 331. The signal held by latch 332 is supplied to a pre-decode address signal line as pre-decode address signal NPDEC[1]. The same is also applied to configurations of latch circuits 304 and 305.

Comparative Example

Here, a second comparative example of the input circuit will be described with reference to FIG. 12. The input circuit illustrated in FIG. 12 includes two scan flip-flop circuits 901 and 901 provided in a manner corresponding to input address signals AD[0] and AD[1], respectively, and pre-decoder 902. Pre-decoder 902 generates pre-decode address signals NPDEC[0] to NPDEC[3] according to internal address signals IAD[0], IAD[1], NIAD[0], and NIAD[1] that are generated by scan flip-flop circuits 901 and 901. In addition, inverted data latch clock NDCK, inverted capture shift clock NCCK, and inverted shift clock NSCK are generated by clock generation circuit 900.

Figure 12:
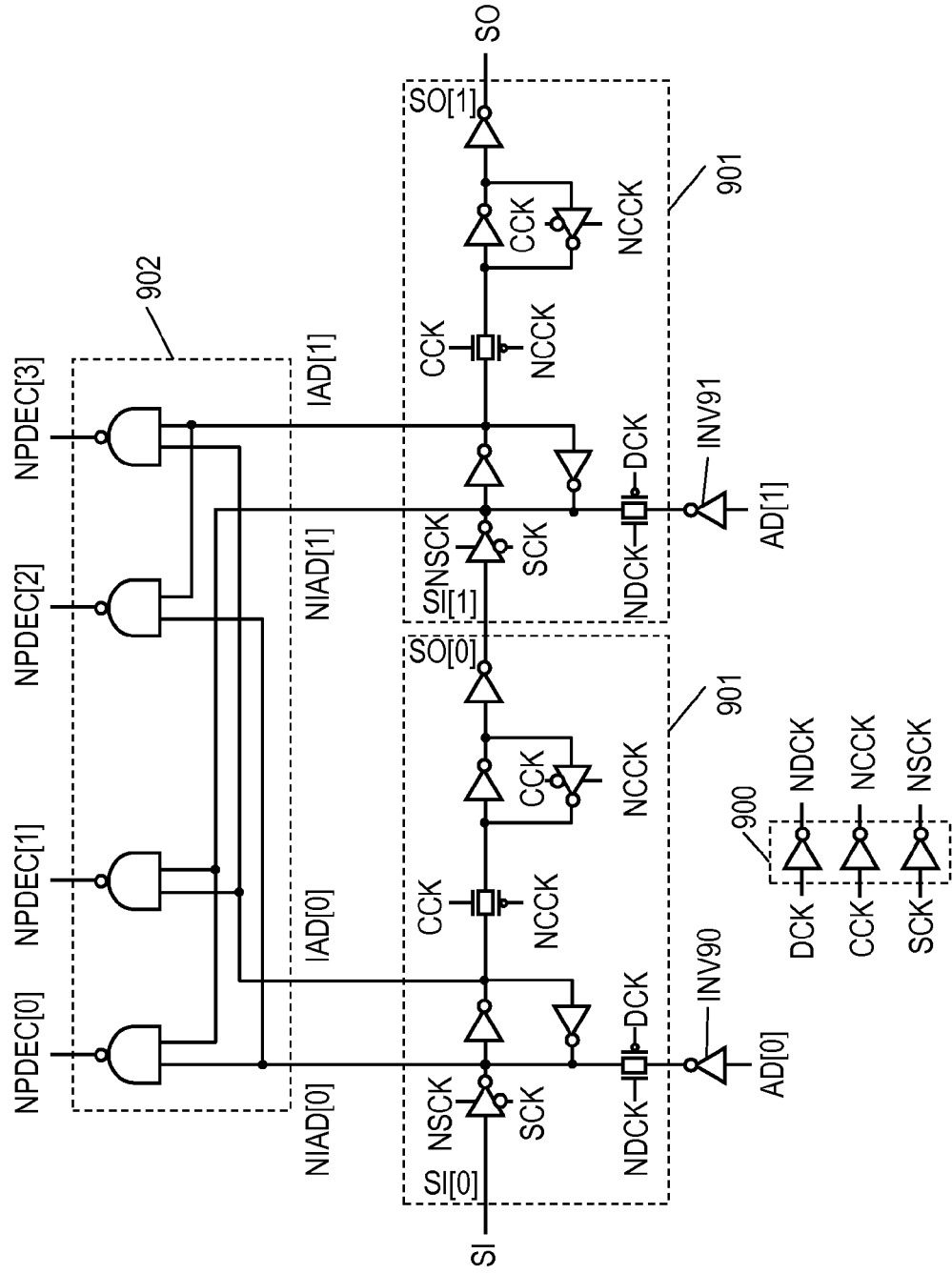
FIG. 12 is a diagram for describing a second comparative example of an input circuit.

When the input circuit illustrated in FIG. 11 and the input circuit (second comparative example of the input circuit) illustrated in FIG. 12 are compared with each other, since inverters 311 and 312 and NAND circuit 313 to 316 included in pre-decoder 301 can be used as input buffers for scan flip-flop circuit 302 and latch circuits 303 to 305 in the input circuit illustrated in FIG. 11, it is possible to reduce further the number of gate stages in a signal path starting from input of input address signals AD[0] to AD[1] and ending at output of pre-decode address signals NPDEC[0] to NPDEC[3] as compared with the same in the input circuit illustrated in FIG. 12 (second comparative example of the input circuit). With this arrangement, a setup time (a time required until pre-decode address signals NPDEC[0] to NPDEC[3] are outputted since input address signals AD[0] and AD[1] are inputted) of an address can be reduced.

As described above, since this arrangement can reduce more the number of scan flip-flop circuits while a reduction in a failure detection rate is suppressed than in the case where the scan flip-flop circuit is provided for each of the output signal lines (here, each pre-decode address signal line), it is possible to reduce a circuit scale of the input circuit. In addition, since the number of components of the input circuit can be reduced, it is possible to reduce power consumption of the input circuit. Furthermore, since the setup time of the address can be reduced more than in the case of the input circuit (second comparative example of the input circuit) illustrated in FIG. 12, it is possible to increase a speed of operation of the input circuit.

Fourth Exemplary Embodiment

Figure 13:
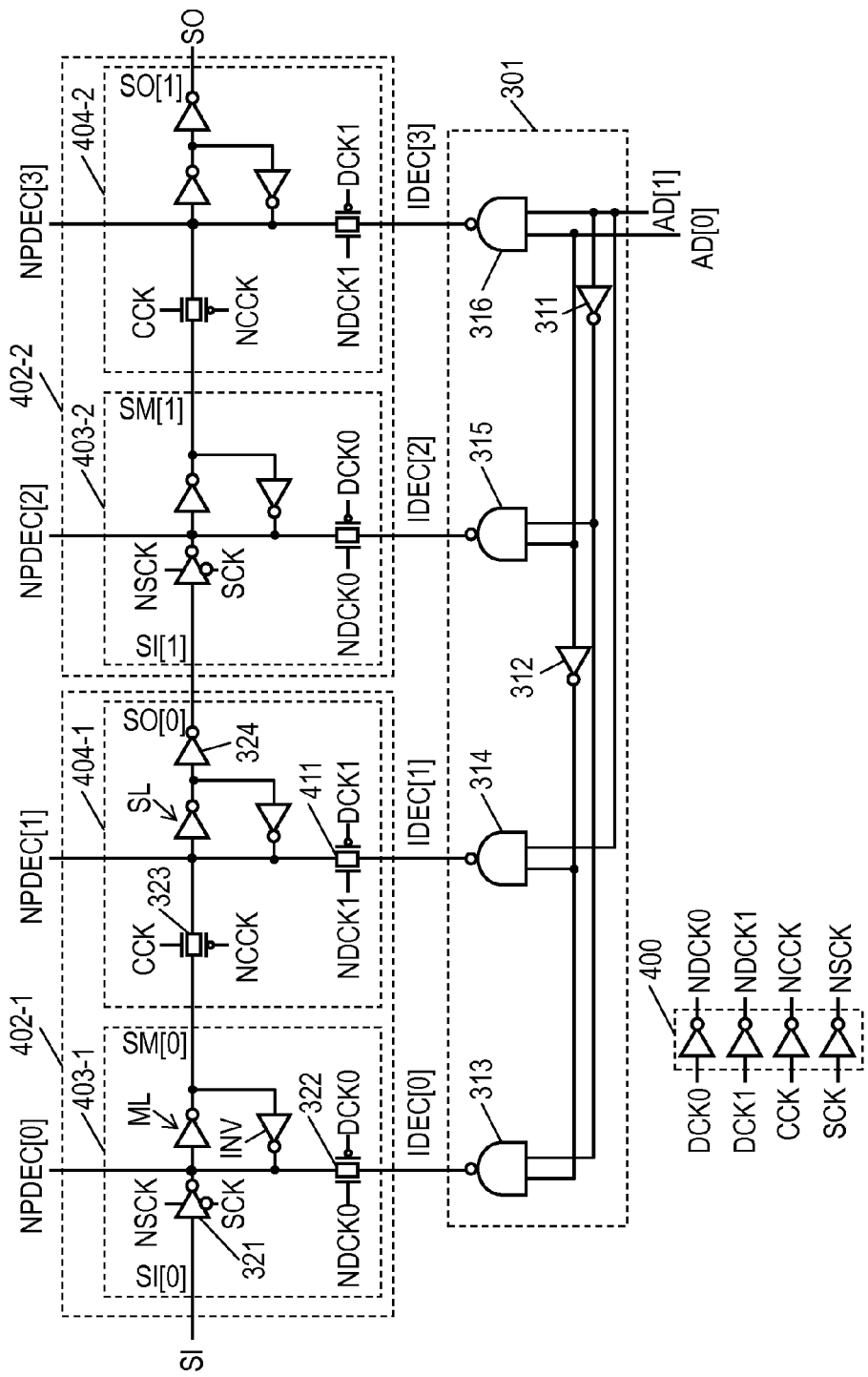
FIG. 13 is a diagram illustrating a configuration example of an input circuit according to a fourth exemplary embodiment.

FIG. 13 illustrates a configuration example of an input circuit according to a fourth exemplary embodiment. The input circuit is provided with pre-decoder 301 and flip-flops 402-1 and 402-2. Flip-flops 402-1 and 402-2 respectively include master latch circuits 403-1 and 403-2 and slave latch circuits 404-1 and 404-2.

Master latch circuit 403-1 (first master latch circuit) selectively captures and holds therein scan-in signal SI[0] and internal decode signal IDEC[0], and generates pre-decoded address signal NPDEC[0] (first output signal) and intermediate signal SM[0] (first intermediate signal) based on the signals that have been captured and are held. Slave latch circuit 404-1 (first slave latch circuit) selectively captures and holds therein intermediate signal SM[0] and internal decode signal IDEC[1], and generates pre-decoded address signal NPDEC[1] (second output signal) and scan-out signal SO[0] based on the signals that have been captured and are held.

Master latch circuit 403-2 (second master latch circuit) selectively captures and holds therein scan-in signal SI[1] and internal decode signal IDEC[2], and generates pre-decoded address signal NPDEC[2] (third output signal) and intermediate signal SM[1] (second intermediate signal) based on the signals that have been captured and are held. Slave latch circuit 404-2 (second slave latch circuit) selectively captures and holds therein intermediate signal SM[1] and internal decode signal IDEC[3], and generates pre-decoded address signal NPDEC[3] (fourth output signal) and scan-out signal SO[1] based on the signals that have been captured and are held.

Master latch circuit 403-1 may include input switching portions 321 and 322 and master latch ML illustrated in FIG. 11. Here, input switching portion 322 switches between capturing and not capturing internal decode signal IDEC[0] in response to data latch clock DCK0 and inverted data latch clock NDCK0. Slave latch circuit 404-1 may include pass transistor 323, slave latch SL, inverter 324, and input switching portion 411 illustrated in FIG. 11. Input switching portion 411 switches between capturing and not capturing internal decode signal IDEC[1] generated by pre-decoder 301 in response to data latch clock DCK1 and inverted data latch clock NDCK1. In this way, according to the input circuit illustrated in FIG. 13, slave latch circuit 404-1 included in scan flip-flop circuit 402-1 is used as latch circuit 303 illustrated in FIG. 11. The same is also applied to scan flip-flop circuit 402-2. Here, inverted data latch clocks NDCK0 and NDCK1, inverted capture shift clock NCCK, and inverted shift clock NSCK may be generated by clock generation circuit 400.

As described above, according to the input circuit illustrated in FIG. 13, since slave latch circuits 404-1 and 404-2 of scan flip-flop circuits 402-1 and 402-2 are used as latch circuits 303 and 305 illustrated in FIG. 11, it is possible to further reduce a circuit scale and power consumption than those of the input circuit illustrated in FIG. 11.

Fifth Exemplary Embodiment

Figure 14:
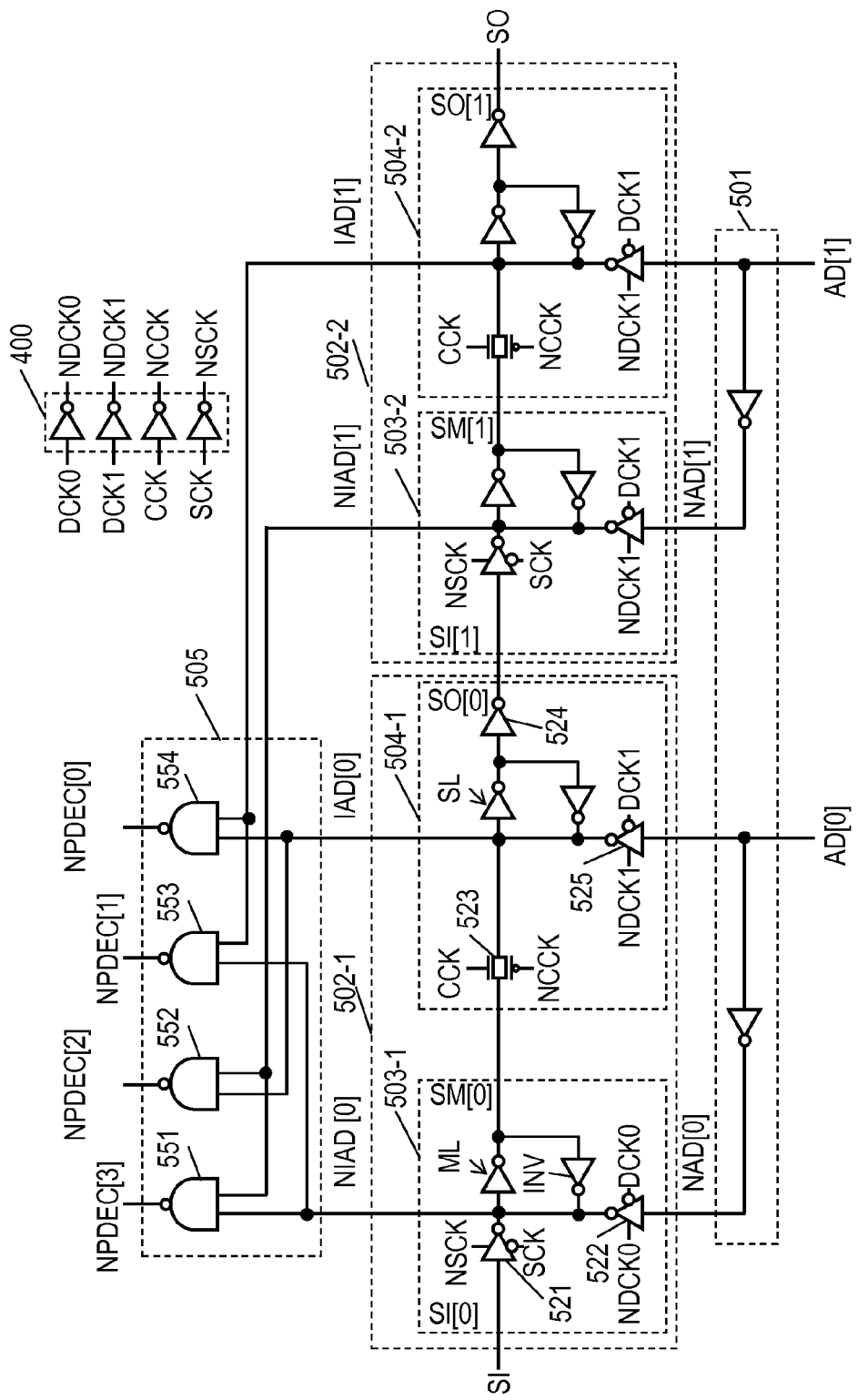
FIG. 14 is a diagram illustrating a configuration example of an input circuit according to a fifth exemplary embodiment.

FIG. 14 illustrates a configuration example of an input circuit according to a fifth exemplary embodiment. The input circuit is provided with input processing circuit 501, scan flip-flop circuits 502-1 and 502-2, and pre-decoder 505. Scan flip-flop circuits 502-1 and 502-2 respectively include master latch circuits 503-1 and 503-2 and slave latch circuits 504-1 and 504-2.

Input processing circuit 501 generates inverted input address signals NAD[0] and NAD[1] in response to input address signals AD[0] and AD[1], respectively, and supplies input address signals AD[0] and AD[1] and inverted input address signals NAD[0] and NAD[1].

Master latch circuit 503-1 (first master latch circuit) selectively captures and hold scan-in signal SI[0] and inverted input address signal NAD[0], and generates internal address signal NIAD[0] and intermediate signal SM[0] based on the signals that have been captured and are held. Slave latch circuit 504-1 (first slave latch circuit) selectively captures and hold intermediate signal SM[0] and input address signal AD[0], and generates internal address signal IAD[0] and scan-out signal SO[0] based on the signals that have been captured and are held. Internal address signal NIAD[0] corresponds to an inverted signal of internal address signal IAD[0].

Master latch circuit 503-2 (second master latch circuit) selectively captures and holds scan-in signal SI[1] and inverted input address signal NAD[1], and generates internal address signal NIAD[1] and intermediate signal SM[1] based on the signals that have been captured and are held. Slave latch circuit 504-2 (second slave latch circuit) selectively captures and holds intermediate signal SM[1] and input address signal AD[1], and generates internal address signal IAD[1] and scan-out signal SO[1] based on the signals that have been captured and are held. Internal address signal NIAD[1] corresponds to an inverted signal of internal address signal IAD[1].

Master latch circuit 503-1 may include input switching portions 521 and 522 and master latch ML. Input switching portion 521 switches between capturing and not capturing scan-in signal SI[0] in response to shift clock SCK and inverted shift clock NSCK. Input switching portion 522 switches between capturing and not capturing inverted input address signal NAD[0] in response to data latch clock DCK0 and inverted data latch clock NDCK0. Master latch ML holds one of scan-in signal SI[0] and inverted input address signal NAD[0] according to capturing operation by input switching portions 521 and 522. The signal thus held in master latch ML is supplied as internal address signal NIAD[0]. Slave latch circuit 504-1 may include pass transistor 523, slave latch SL, inverter 524, and input switching portion 525. Pass transistor 523 switches between transferring and not transferring an output signal of master latch ML to slave latch SL in response to capture shift clock CCK and inverted capture shift clock NCCK. Input switching portion 525 switches between capturing and not capturing input address signal AD[0] in response to data latch clock DCK1 and inverted data latch clock NDCK1. Slave latch SL holds one of the output signal of master latch ML and input address signal AD[0] according to capturing operation by pass transistor 523 and input switching portion 525. Inverter 524 inverts the output signal of slave latch SL and outputs the resultant as scan-out signal SO[0]. The signal held in slave latch SL is supplied as internal address signal IAD[0]. The same is also applied to scan flip-flop circuit 502-2.

When the input circuit illustrated in FIG. 14 and the input circuit (second comparative example of the input circuit) illustrated in FIG. 12 are compared with each other, in the input circuit illustrated in FIG. 12, a load at an output terminal (output terminal for outputting internal address signals NIAD[0] and NIAD[1]) of scan flip-flop circuit 901 is large, and therefore a changing speed of internal address signals IAD[0] and IAD[1] to be transferred to a critical path becomes slow when a changing speed of internal address signals NIAD[0] and NIAD[1] are slow. In contrast, according to the input circuit illustrated in FIG. 14, since internal address signals IAD[0] and IAD[1] are not affected by a load at an output terminal (output terminal for outputting internal address signals NIAD[0] and NIAD[1]) of scan flip-flop circuit 502-1, it is possible to increase a changing speed of internal address signal IAD[0] and IAD[1] to be transferred to the critical path.

As described above, since the number of the scan flip-flop circuits can be further reduced while the reduction in a failure detection rate is suppressed than in the case where the scan flip-flop circuit is provided for each output signal line (here, each pre-decode address signal line), it is possible to reduce a circuit scale of the input circuit. In addition, since the number of components of the input circuit can be reduced, power consumption of the input circuit can be reduced. Further, the changing speed of internal address signals IAD[0] and IAD[1] is further increased than in the case of the input circuit (second comparative example of the input circuit) illustrated in FIG. 12.

ANOTHER EXEMPLARY EMBODIMENT

Figure 15:
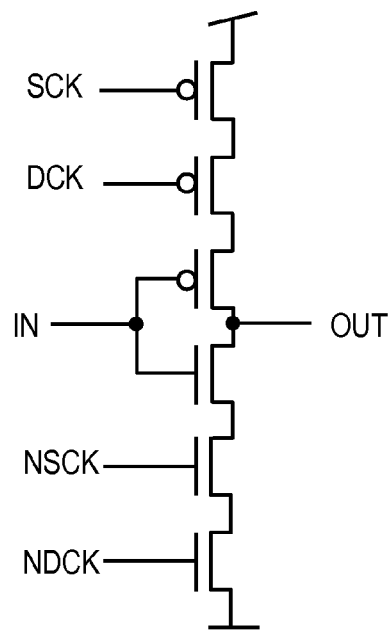
FIG. 15 is a diagram illustrating a first modified example of a feedback element.
Figure 16:
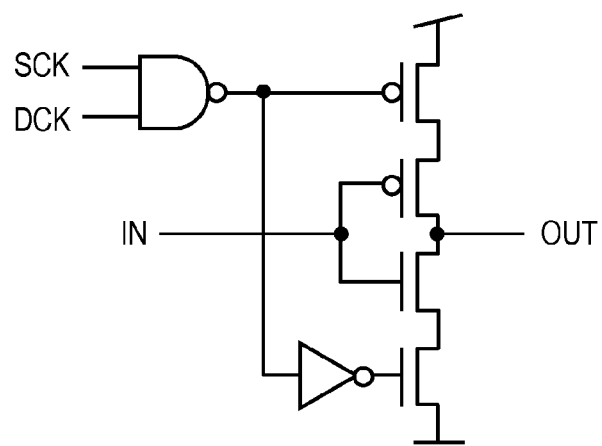
FIG. 16 is a diagram illustrating a second modified example of a feedback element.

In the foregoing descriptions, feedback element INV that constitutes master latch ML may be replaced with a circuit illustrated in FIG. 15 or 16. By using the circuits illustrated in FIG. 15 or 16 as feedback element INV, data collision can be suppressed, and therefore power consumption can be reduced, and operational stability can be improved.

As described above, the input circuit described above can reduce a circuit scale and power consumption while the reduction in a failure detection rate is suppressed, and therefore is useful for a semiconductor integrated circuit (e.g., SRAM etc.) to which a scan path test method is applied.

What is claimed is:
1. An input circuit comprising:
a combination circuit that generates first and second internal signals according to first and second input signals, respectively;
a first master latch circuit that selectively captures and holds a scan-in signal and the first internal signal generated by the combination circuit, and generates a first output signal and a first intermediate signal based on the signals thus captured and held; and
a first slave latch circuit that selectively captures and holds the first intermediate signal generated by the first master latch circuit and the second internal signal generated by the combination circuit, and generates a second output signal and a scan-out signal based on the signals thus captured and held, wherein:
the first master latch circuit captures the scan-in signal according to a first clock signal,
the first master latch circuit captures the first internal signal according to a second clock signal,
the first slave latch circuit captures the first intermediate signal according to a third clock signal,
the first slave latch circuit captures the second internal signal according to a fourth clock signal, and
the second clock signal and the fourth clock are different clocks.
2. The input circuit according to claim 1, further comprising:
a second master latch circuit; and
a second slave latch circuit,
wherein the combination circuit further generates third and fourth internal signals according to the first and second input signals, respectively,
the second master latch circuit receives the scan-out signal generated by the first slave latch circuit as a scan-in signal, selectively captures and holds the scan-in signal and the third internal signal generated by the combina- tion circuit, and outputs a third output signal and a second intermediate signal based on the signals thus captured and held, and the second slave latch circuit selectively captures and holds the second intermediate signal generated by the second master latch circuit and the fourth internal signal generated by the combination circuit, and generates a fourth output signal and a scan-out signal based on the signals thus captured and held.

3. The input circuit according to claim 2,
wherein the first and second input signals correspond to an address signal.

4. The input circuit according to claim 1,
wherein the first input signal corresponds to one of a write data signal and a write data mask signal, and
the second input signal corresponds to a remaining one of the write data signal and the write data mask signal.

5. The input circuit according to claim 1,
wherein the first master latch circuit includes a first input switching portion that switches between capturing and not capturing the first internal signal generated by the combination circuit,
the first slave latch circuit includes a second input switching portion that switches between capturing and not capturing the second internal signal generated by the combination circuit, and
the first and second input switching portions are individually configured of pass transistors that switch between conduction and non-conduction in response to a clock.

6. The input circuit according to claim 1,
wherein the second internal signal corresponds to an inverted signal of the first internal signal.

7. The input circuit according to claim 1, wherein the first clock signal and the third clock are different clocks.

8. An input circuit comprising:
a first combination circuit that generates first and second internal signals according to first and second input signals, respectively;
a first master latch circuit that selectively captures and holds a scan-in signal and the first internal signal generated by the first combination circuit, and generates a first output signal and a first intermediate signal based on the signals thus captured and held;
a first slave latch circuit that selectively captures and holds the first intermediate signal generated by the first master latch circuit and the second internal signal generated by the combination circuit, and generates a second output signal and a first scan-out signal based on the signals thus captured and held;
a second combination circuit that generates third and fourth internal signals according to third and fourth input signals, respectively;
a second master latch circuit that selectively captures and holds the first scan-out signal and the third internal signal generated by the second combination circuit, and generates a third output signal and a second intermediate signal based on the signals thus captured and held; and
a second slave latch circuit that selectively captures and holds the second intermediate signal generated by the second master latch circuit and the fourth internal signal generated by the second combination circuit, and generates a fourth output signal and a second scan-out signal based on the signals thus captured and held, wherein:
the first master latch circuit captures the scan-in signal according to a first clock signal,
the first slave latch circuit captures the first intermediate signal according to a third clock signal,
the second master latch circuit captures and holds the first scan-out signal according to the first clock signal, and
the second slave latch circuit captures the second intermediate signal according to the third clock signal.

9. The input circuit according to claim 8, wherein:
the first input signal corresponds to one of a write data signal and a write data mask signal, and
the second input signal corresponds to a remaining one of the write data signal and the write data mask signal.

10. The input circuit according to claim 8, wherein:
the first master latch circuit includes a first input switching portion that switches between capturing and not capturing the first internal signal generated by the combination circuit,
the first slave latch circuit includes a second input switching portion that switches between capturing and not capturing the second internal signal generated by the combination circuit,
the first input switching portion is configured of a first pass transistor that switches between a conduction state and a non-conduction state in response to the third clock signal, and
the second input switching portion is configured of a second pass transistor that switches between a conduction state and a non-conduction state in response to a clock signal.

* * * * *